(12) United States Patent
Sakaue (10) Patent No.: US 12,528,153 B2
(45) Date of Patent: Jan. 20, 2026

(54) PROCESSING METHOD AND PROCESSING APPARATUS

(71) Applicant: Tokyo Electron Limited, Tokyo (JP)

(72) Inventor: Takashi Sakaue, Kumamoto (JP)

(73) Assignee: Tokyo Electron Limited, Tokyo (JP)

( * ) Notice: Subject to any disclaimer, the term of this patent is extended or adjusted under 35 U.S.C. 154(b) by 687 days.

(21) Appl. No.: 17/904,297

(22) PCT Filed: Feb. 4, 2021

(86) PCT No.: PCT/JP2021/004173
§ 371 (c)(1),
(2) Date: Aug. 16, 2022

(87) PCT Pub. No.: WO2021/166668
PCT Pub. Date: Aug. 26, 2021

(65) Prior Publication Data
US 2023/0060918 A1    Mar. 2, 2023

(30) Foreign Application Priority Data

Feb. 17, 2020    (JP) .................................. 2020-024474

(51) Int. Cl.
*B24B 49/04*        (2006.01)
*B24B 7/22*         (2006.01)
(Continued)

(52) U.S. Cl.
CPC .............. *B24B 49/04* (2013.01); *B24B 7/228* (2013.01); *B24B 51/00* (2013.01); *H01L 21/304* (2013.01)

(58) Field of Classification Search
CPC ..... B24B 7/228; B24B 37/005; B24B 37/013; B24B 37/04; B24B 37/042; B24B 37/10;
(Continued)

(56) References Cited

U.S. PATENT DOCUMENTS

2015/0239093 A1*  8/2015  Fukui ................ H01L 23/49524
                                                              451/5
2016/0059375 A1*  3/2016  Ito ........................... H01L 22/12
                                                              451/6
(Continued)

FOREIGN PATENT DOCUMENTS

CN       106563980 A    4/2017
JP       H7124857 A     5/1995
(Continued)

OTHER PUBLICATIONS

International Search Report of PCT/JP2021/004173 dated Apr. 6, 2021.

*Primary Examiner* — Joel D Crandall
(74) *Attorney, Agent, or Firm* — Shih IP Law Group, PLLC (57) ABSTRACT

A processing method of processing a substrate in a processing apparatus includes performing a first grinding processing on the substrate in a first grinder; performing a second grinding processing on the substrate in a second grinder; performing a first re-grinding processing on the substrate in the first grinder; and performing a second re-grinding processing on the substrate in the second grinder. The substrate is ground to a final thickness in the second re-grinding processing.

12 Claims, 7 Drawing Sheets

(51) Int. Cl.
*B24B 51/00* (2006.01)
*H01L 21/304* (2006.01)

(58) Field of Classification Search
CPC ....... B24B 37/107; B24B 49/02; B24B 49/03; B24B 49/04; B24B 49/12
See application file for complete search history.

(56) References Cited

U.S. PATENT DOCUMENTS

2017/0095902 A1* 4/2017 Yoshida .................. B24B 7/228
2021/0362290 A1 11/2021 Kaneko

FOREIGN PATENT DOCUMENTS

| | | | | |
|---|---|---|---|---|
| JP | H9174394 A | 7/1997 | | |
| JP | H11-309653 A | 11/1999 | | |
| JP | 2005313297 A | 11/2005 | | |
| JP | 2009-090389 A | 4/2009 | | |
| JP | 2013-119123 A | 6/2013 | | |
| JP | 2018036213 A * | 3/2018 | ............. | B24B 49/04 |
| WO | WO-0188970 A1 * | 11/2001 | ........... | B24B 41/068 |
| WO | 2020/012951 A1 | 1/2020 | | |

\* cited by examiner

| | GRINDING AMOUNT [μm] | | | | | | DETERMINATION |
|---|---|---|---|---|---|---|---|
| | ROUGH GRINDING | FIRST GRINDING | SECOND GRINDING | ROUGH GRINDING | FIRST RE-GRINDING | SECOND RE-GRINDING | |
| COMPARATIVE EXAMPLE | / | 635 | 20 | / | 0 | 20 | D |
| EXPERIMENTAL EXAMPLE 1 | / | 605 | 20 | / | 30 | 20 | C |
| EXPERIMENTAL EXAMPLE 2 | / | 317.5 | 20 | / | 317.5 | 20 | B |
| EXPERIMENTAL EXAMPLE 3 | 575 | 30 | 20 | 0 | 30 | 20 | A |

PROCESSING METHOD AND PROCESSING APPARATUS

CROSS-REFERENCE TO RELATED APPLICATIONS

This Application is a U.S. national phase application under 35 U.S.C. § 371 of PCT Application No. PCT/JP2021/004173 filed on Feb. 4, 2021, which claims the benefit of Japanese Patent Application No. 2020-024474 filed on Feb. 17, 2020, the entire disclosures of which are incorporated herein by reference.

TECHNICAL FIELD

The various aspects and embodiments described herein pertain generally to a processing method and a processing apparatus.

BACKGROUND

Patent Document 1 discloses a grinding apparatus for a wafer including a grinding device for the wafer, an inclination adjusting device for adjusting an inclination of a rotation axis of the grinding device, and a grinding condition storage device for storing grinding conditions for the wafer. According to the grinding apparatus described in Patent Document 1, by adjusting the inclination of the rotation axis of the grinding device based on the information stored in the grinding condition storage device, it is attempted to minimize non-uniformity in the thickness of the wafer.

PRIOR ART DOCUMENT

Patent Document 1: Japanese Patent Laid-open Publication No. 2009-090389

Means for Solving the Problems

In an exemplary embodiment, a processing method of processing a substrate in a processing apparatus includes performing a first grinding processing on the substrate in a first grinder; performing a second grinding processing on the substrate in a second grinder; performing a first re-grinding processing on the substrate in the first grinder; and performing a second re-grinding processing on the substrate in the second grinder. The substrate is ground to a final thickness in the second re-grinding processing.

DETAILED DESCRIPTION

Recently, in a manufacturing process for a semiconductor device, in a combined substrate in which a semiconductor substrate having a plurality of devices such as electronic circuits formed on a front surface thereof (hereinafter, referred to as "first substrate") and a second substrate are bonded to each other, the first substrate is thinned by grinding a rear surface thereof.

The thinning of this first substrate is performed by bringing a grinding whetstone into contact with the rear surface of the first substrate while holding a rear surface of the second substrate with a substrate holder. However, when performing the grinding of the first substrate in this way, the degree of flatness (TTV: Total Thickness Variation) of the first substrate after being ground may be degraded due to the relative inclination between the grinding whetstone in contact with the rear surface of the first substrate and a substrate holding surface holding the second substrate. To be specific, when the processing apparatus temporarily enters a standby state to replace the grinding whetstone for grinding the first substrate, or when a grinding condition in the processing apparatus is changed, the parallelism between the grinding whetstone and the substrate holding surface changes due to changes in device characteristics or environmental characteristics (for example, a change in a device temperature or an atmosphere temperature, a change in a surface state of the grinding whetstone, etc.) before and after the standby of the processing apparatus or before and after the change of the grinding condition. As a result, when a grinding processing immediately after returning from the standby state is performed under the same conditions as the grinding processing before the standby, there is a risk that the TTV of the first substrate may be deteriorated because of the change in the parallelism between the grinding whetstone and the substrate holding surface.

The processing method disclosed in Patent Document 1 described above uses the grinding apparatus configured to grinding the first substrate (wafer) to a uniform thickness by adjusting the inclination of the rotation shaft of the grinding whetstone (grinding device). In Patent Document 1, however, nothing is mentioned about considering the device characteristics or environmental characteristics before and after the standby state of the processing apparatus as stated above. Further, in the method described in Patent Document 1, since it is necessary to grind an additional substrate (for example, a dummy wafer) for adjusting the inclination of the rotation shaft of the grinding whetstone (grinding device), it takes time to adjust the inclination of the rotation shaft. Besides, the substrate once used for the adjustment of the inclination needs to be discarded. In view of these, there is still a room for improvement in the conventional grinding processing for the substrate.

In view of the foregoing, the present disclosure provides a technique enabling to appropriately improve the degree of flatness of the substrate after being ground. In particular, it is possible to appropriately improve the flatness of a substrate held by the substrate holder for the first time after the processing apparatus returns from the standby state or after the change of the grinding condition. Hereinafter, a processing apparatus and a processing method according to the present exemplary embodiment will be described with reference to the accompanying drawings. Further, in the present specification and the drawings, parts having substantially the same functions and configurations will be assigned same reference numerals, and redundant description thereof will be omitted.

Figure 1:
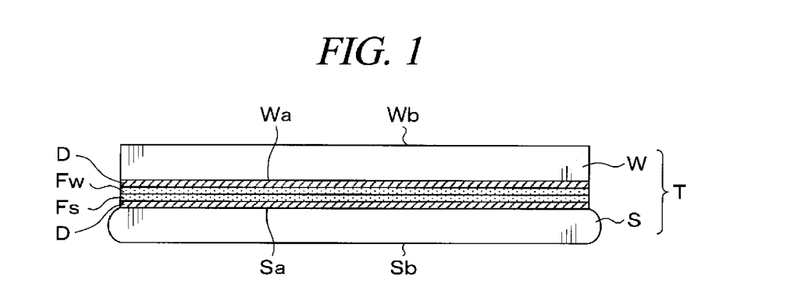
FIG. 1 is an explanatory diagram illustrating an example structure of a combined wafer.

In a processing apparatus 1 to be described later according to the present exemplary embodiment, a processing is performed on a combined wafer T as a combined substrate in which a first wafer W as a first substrate and a second wafer S as a second substrate are bonded as shown in FIG. 1. In the processing apparatus 1, the first wafer W is thinned. Hereinafter, in the first wafer W, a surface to be bonded to the second wafer S will be referred to as a front surface Wa, and a surface opposite to the front surface Wa will be referred to as a rear surface Wb. Likewise, in the second wafer S, a surface to be bonded to the first wafer W will be referred to as a front surface Sa, and a surface opposite to the front surface Sa will be referred to as a rear surface Sb.

The first wafer W is a semiconductor wafer such as, but not limited to, a silicon wafer, and has, on the front surface Wa thereof, a device layer D including a plurality of devices. A surface film Fw is formed on the device layer D, and the device layer D is bonded to the second wafer S with this surface film Fw therebetween. The surface film Fw may be, by way of example, an oxide film (a $SiO_2$ film or a TEOS film), a SiC film, a SiCN film, an adhesive, or the like.

The second wafer S is, for example, a wafer that supports the first wafer W. A surface film Fs is formed on the front surface Sa of the second wafer S, and a peripheral portion of the second wafer S is chamfered. The surface film Fs may be, by way of non-limiting example, an oxide film (a $SiO_2$ film or a TEOS film), a SiC film, a SiCN film, an adhesive, or the like. Further, the second wafer S functions as a protection member (support wafer) for protecting the device layer D of the first wafer W. Furthermore, the second wafer S does not need to be a support wafer, but it may be, like the first wafer W, a device wafer on which a device layer is formed. In this case, a surface film Fs is formed on the front surface Sa of the second wafer S with the device layer therebetween.

In the drawings referred to in the following description, illustration of the device layer D and the surface films Fw and Fs may sometimes be omitted for simplicity of illustration.

Figure 2:
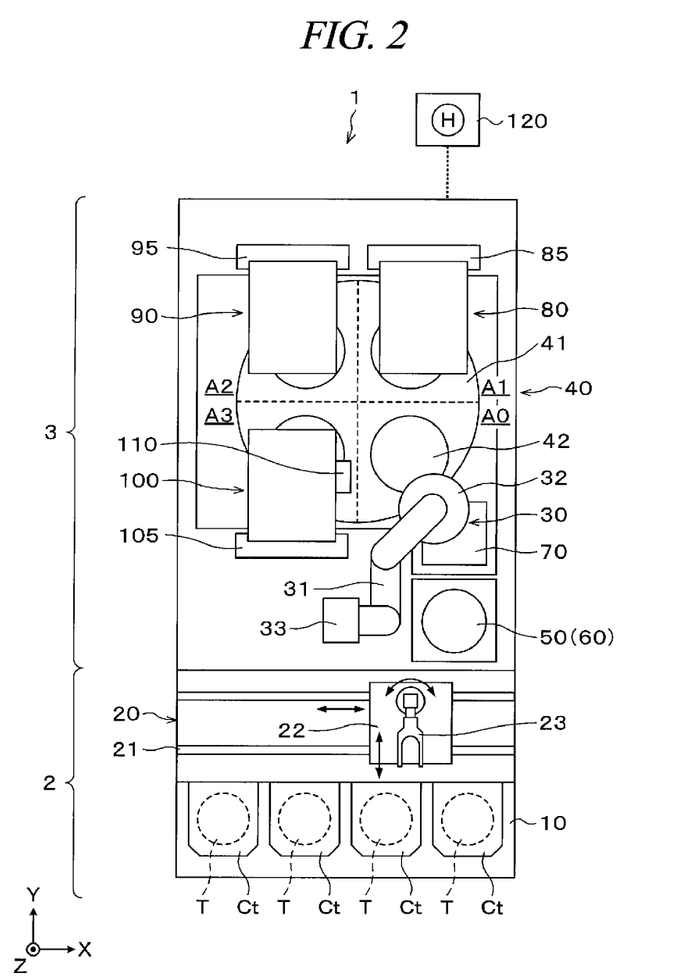
FIG. 2 is a plan view schematically illustrating an example configuration of a processing apparatus.

As depicted in FIG. 2, the processing apparatus 1 has a structure in which a carry-in/out station 2 and a processing station 3 are connected as one body. In the carry-in/out station 2, a cassette Ct capable of accommodating a plurality of combined wafers T therein is carried to/from the outside, for example. The processing station 3 is equipped with various kinds of processing apparatuses each configured to perform a required processing on the combined wafer T.

The carry-in/out station 2 is equipped with a cassette placing table 10. In the shown example, a plurality of, for example, four cassettes Ct can be arranged on the cassette placing table 10 in a row in the X-axis direction. Further, the number of the cassettes Ct placed on the cassette placing table 10 is not limited to the example of the present exemplary embodiment but may be selected as required.

In the carry-in/out station 2, a wafer transfer section 20 is provided adjacent to the cassette placing table 10 on the positive Y-axis side of the cassette placing table 10. A wafer transfer device 22 configured to be movable on a transfer path 21 extending in the X-axis direction is provided in the wafer transfer section 20.

The wafer transfer device 22 is equipped with a transfer fork 23 configured to hold and transfer the combined wafer T before and after being subjected to a grinding processing.

The transfer fork 23 attracts and holds the combined wafer T with its biforked leading ends. Further, the transfer fork 23 is configured to be movable in a horizontal direction and a vertical direction and pivotable around a horizontal axis and a vertical axis. In addition, the configuration of the wafer transfer device 22 is not limited to the present exemplary embodiment, and it may have any of various other configurations. For example, the wafer transfer device 22 is configured to transfer the combined wafer T to/from the cassette Ct of the cassette placing table 10, an alignment unit 50, and a first cleaning unit 60.

In the processing station 3, a processing such as grinding or cleaning is performed on the combined wafer T. The processing station 3 includes a transfer unit 30 configured to transfer the combined wafer T; a grinding unit 40 configured to perform a grinding processing on the first wafer W; the alignment unit 50 configured to adjust the direction of the combined wafer T in a horizontal direction before the grinding processing; the first cleaning unit 60 configured to clean the first wafer W after the grinding processing; and a second cleaning unit 70 configured to clean the rear surface Sb of the second wafer S after the grinding processing.

The transfer unit 30 is a multi-joint robot equipped with a plurality of, for example, three arms 31. Each of the three arms 31 is configured to be pivotable. The arm 31 at a leading end is equipped with a transfer pad 32 configured to attract and hold the combined wafer T. Further, the arm 31 at a base end is mounted to an elevating mechanism 33 configured to move this arm 31 in a vertical direction. Furthermore, the configuration of the transfer unit 30 is not limited to the present exemplary embodiment, and any of various configurations may be adopted. The transfer unit 30 is capable of transferring the combined wafer T to/from a delivery position A0 of the grinding unit 40 to be described later, the alignment unit 50, the first cleaning unit 60, and the second cleaning unit 70.

The grinding unit 40 is provided with a rotary table 41. Four chucks 42 configured to attract and hold the combined wafer T are provided on the rotary table 41. The four chucks 42 are configured to be moved to the delivery position A0 and processing positions A1 to A3 as the rotary table 41 rotates. Further, each of the four chucks 42 is configured to be rotatable about a vertical axis by a rotating mechanism (not shown).

At the delivery position A0, delivery of the combined wafer T is performed by the transfer unit 30. A rough grinding unit 80 is disposed at the processing position A1 to roughly grind the first wafer W. An intermediate grinding unit 90 is disposed at the processing position A2 to grind the first wafer W to an intermediate level. A finishing grinding unit 100 is disposed at the processing position A3 to finely grind the first wafer W.

The chuck 42 may be, for example, a porous chuck, and it attracts and holds the rear surface Sb of the second wafer S that constitutes the combined wafer T. When viewed from the side, a front surface of the chuck 42, that is, a holding surface holding the combined wafer T has a protruding shape with a central portion thereof protruding higher than an end portion thereof. Further, since this protrusion of the central portion is minute, illustration of the protruding shape of the chuck 42 is omitted in the drawings.

Figure 3:
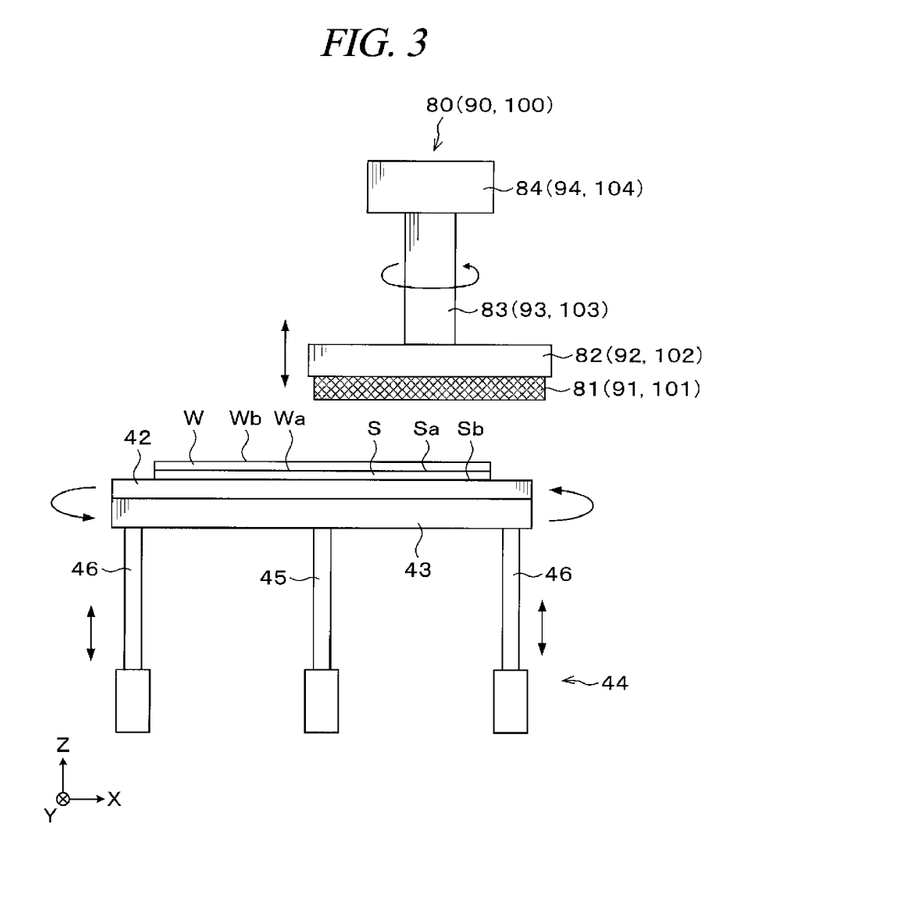
FIG. 3 is a side view illustrating an example configuration of each grinding unit.

As shown in FIG. 3, the chuck 42 is held by a chuck base 43. The chuck base 43 is provided with an inclination adjusting device 44 configured to adjust an inclination of the chuck 42 and the chuck base 43 from a horizontal direction. The inclination adjusting device 44 has a fixed shaft 45 and a plurality of elevating shafts 46 provided on a bottom surface of the chuck base 43. Each of the elevating shafts 46 is configured to be extensible/contractible, and moves the chuck base 43 up and down. By using this inclination adjusting device 44, one end of an outer periphery of the chuck base 43 can be raised or lowered in a vertical direction by the elevating shafts 46 with respect to the other end thereof (a position corresponding to the fixed shaft 45), thus allowing the chuck 42 and the chuck base 43 to be inclined. Therefore, it is possible to adjust relative inclinations between the chuck 42 and the grinding units at the processing positions A1 to A3, that is, an inclination of rear surface Wb of the first wafer W with respect to each of the grinding whetstones belonging to the various grinding units.

In addition, the configuration of the inclination adjusting device 44 is not limited to the above-described example, and the inclination adjusting device 44 may have any of various other configurations as long as it is capable of adjusting relative angle (parallelism) between the first wafer W and the grinding whetstone.

As depicted in FIG. 3, the rough grinding unit 80 as a rough grinding device or a first grinder includes a rough grinding wheel 81 equipped with an annular rough grinding whetstone on a bottom surface thereof; a mount 82 configured to support the rough grinding wheel 81; a spindle 83 configured to rotate the rough grinding wheel 81 via the mount 82; and a driver 84 incorporating therein, for example, a motor (not shown). Further, the rough grinding unit 80 is configured to be moved in a vertical direction and a horizontal direction along a supporting column 85 shown in FIG. 2. In the rough grinding unit 80, by respectively rotating the chuck 42 and the rough grinding wheel 81 while keeping the first wafer W of the combined wafer T held by the chuck 42 in contact with a part of an arc of the rough grinding whetstone, the rear surface Wb of the first wafer W is roughly ground.

As illustrated in FIG. 2 and FIG. 3, the intermediate grinding unit 90 as the first grinder has the same configuration as the rough grinding unit 80. That is, the intermediate grinding unit 90 has an intermediate grinding wheel 91 provided with an annular intermediate grinding whetstone; a mount 92; a spindle 93; a driver 94; and a supporting column 95. Further, a particle size of abrasive grains of the intermediate grinding whetstone is smaller than a particle size of abrasive grains of the rough grinding whetstone.

As shown in FIG. 2 and FIG. 3, the finishing grinding unit 100 as a second grinder has the same configuration as the rough grinding unit 80 and the intermediate grinding unit 90. That is, the finishing grinding unit 100 has a finishing grinding wheel 101 provided with an annular finishing grinding whetstone; a mount 102; a spindle 103; a driver 104; and a supporting column 105. In addition, a particle size of abrasive grains of the finishing grinding whetstone is smaller than the particle size of abrasive grains of the intermediate grinding whetstone.

Moreover, the processing station 3 is equipped with a thickness measuring device 110 as a thickness distribution measuring device configured to measure the thickness of the first wafer W upon the completion of the grinding processing by the finishing grinding unit 100. The thickness measuring device 110 is provided at, for example, the processing position A3 or the delivery position A0. The thickness measuring device 110 includes, by way of example, a non-contact type sensor (not shown) and a calculation unit (not shown). In the thickness measuring device 110, a thickness distribution of the first wafer W is acquired from measurement results (thicknesses of the first wafer W) obtained at multiple points by the sensor, and TTV data of the first wafer W is obtained.

As depicted in FIG. 2, the above-described processing apparatus 1 is equipped with a controller 120. The controller 120 is, for example, a computer equipped with a CPU, a memory, and the like, and has a program storage (not shown). The program storage stores therein a program for controlling the processing of the combined wafer T in the processing apparatus 1. Further, the program storage also stores therein a program for controlling the operations of the above-described various kinds of processing units and a driving system such as the transfer devices to implement a processing to be described later in the processing apparatus 1. Further, the program may be recorded on a computer-readable recording medium H and installed from this recording medium H to the controller 120.

Now, a processing method performed by using the processing apparatus 1 having the above-described configuration will be discussed. In the present exemplary embodiment, the combined wafer T is previously formed by bonding the first wafer W and the second wafer S in a bonding apparatus (not shown) outside the processing apparatus 1.

First, the cassette Ct accommodating therein the plurality of combined wafers T is placed on the cassette placing table 10 of the carry-in/out station 2. Then, the first sheet of combined wafer T is taken out from the cassette Ct by the transfer fork 23 of the wafer transfer device 22, and transferred to the alignment unit 50 of the processing station 3. In the alignment unit 50, by adjusting the position of a notch (not shown) formed at the first wafer W, the direction of the combined wafer T in a horizontal direction is adjusted (process P1 of FIG. 5).

Figure 4A:
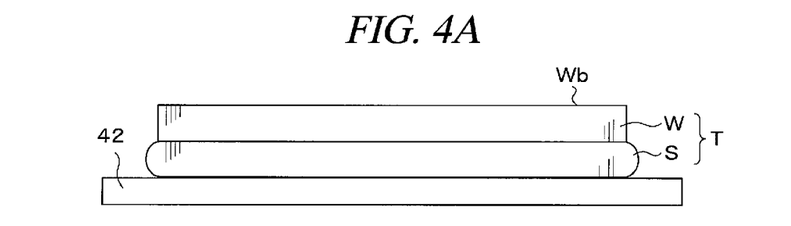
FIG. 4A to FIG. 4E are explanatory diagrams illustrating an example of main processes of a processing.

The combined wafer T whose direction in the horizontal direction has been adjusted is then transferred by the transfer unit 30 from the alignment unit 50 to the chuck 42 at the delivery position A0, as shown in FIG. 4A. Then, by rotating the rotary table 41, the chuck 42 is moved to the processing positions A1 to A3 in sequence.

Figure 5:
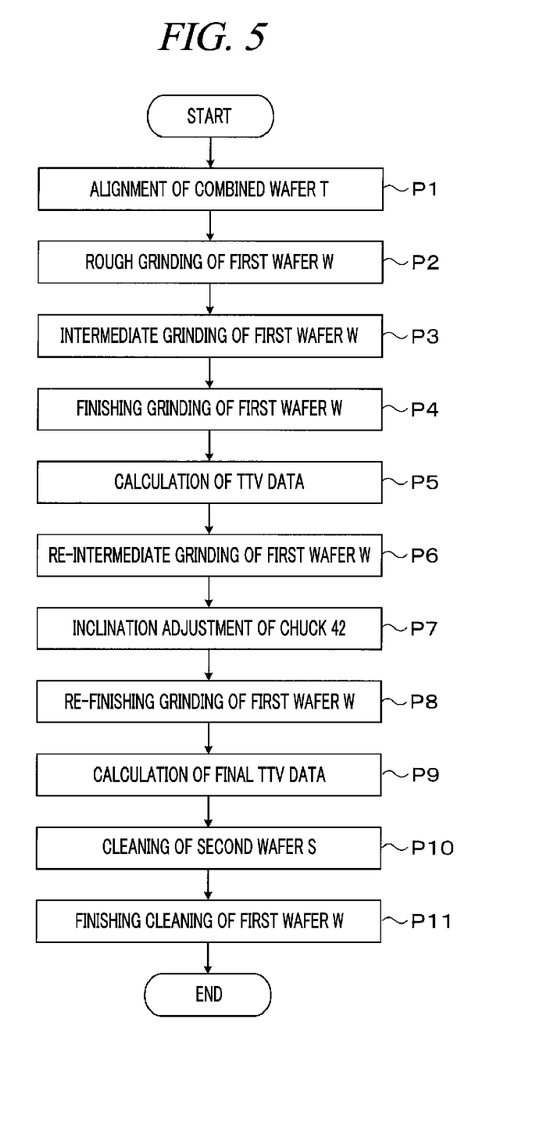
FIG. 5 is a flowchart illustrating an example of the main processes of the processing.

At the processing position A1, the rear surface Wb of the first wafer W is roughly ground by the rough grinding unit 80 (process P2 of FIG. 5). At the processing position A2, the rear surface Wb of the first wafer W is ground to an intermediate level by the intermediate grinding unit 90 (process P3 of FIG. 5). Further, at the processing position A3, the rear surface Wb of the first wafer W is finely ground by the finishing grinding unit 100 (process P4 of FIG. 5).

Figure 6:
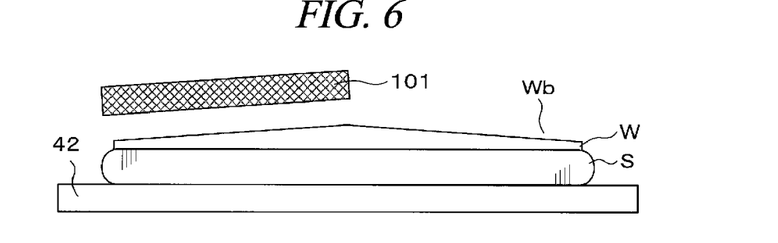
FIG. 6 is an explanatory diagram schematically illustrating deterioration of a TTV of a first wafer.

Here, in the finishing grinding of the process P4, the parallelism between the finishing grinding unit 100 and the chuck 42 may sometimes be deteriorated due to, for example, a device characteristic resulted from wear-out of the finishing grinding whetstone, the temperature of the grinding unit 40, etc., or due to an environmental characteristic resulted from an atmosphere temperature of the processing apparatus 1, etc. In particular, when the combined wafer T subjected to the grinding processing is a first sheet of combined wafer T processed immediately after the processing apparatus 1 returns from the standby state or immediately after a grinding condition is changed, there is a likelihood that the parallelism may be largely changed from the state before the standby of the processing apparatus 1 as stated above. Then, if the first wafer W is subjected to the finishing grinding to a final thickness in the state that the parallelism between the finishing grinding unit 100 and the chuck 42 is deteriorated in this way, there is a risk that the TTV of the first wafer W after being subjected to the finishing grinding may be deteriorated, as shown in FIG. 6.

Figure 4B:
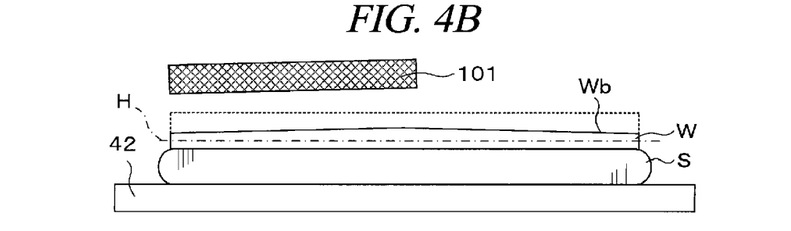

To solve this problem, in the processing method according to the present exemplary embodiment, in the grinding processing of the first sheet of combined wafer T by the finishing grinding unit 100 in the process P4, the grinding of the combined wafer T is performed just to the extent that the thickness of the first wafer W does not reach a final thickness H, as illustrated in FIG. 4B, and, later, a re-grinding of the first wafer W is performed. As a result, the TTV of the first wafer W may be improved.

Figure 4C:
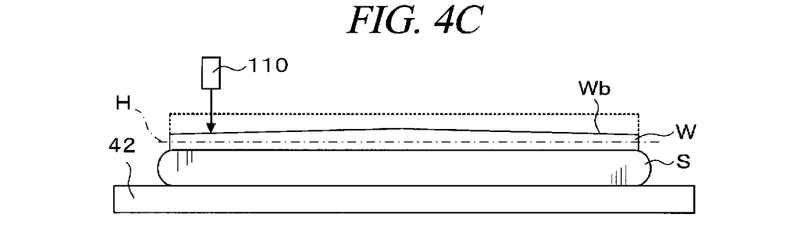

Specifically, as shown in FIG. 4C, by measuring the thickness of the first wafer W after being ground in the process P4 at multiple points by the thickness measuring device 110, the thickness distribution of the first wafer W is acquired, and TTV data is calculated from this thickness distribution (process P5 of FIG. 5). The calculated TTV data is outputted to the controller 120.

After calculating the TTV data of the first wafer W, the rotary table 41 is then rotated to move the chuck 42 to the processing positions A2 and A3 in sequence.

At the processing position A2, the rear surface Wb of the first wafer W is re-ground (ground to an intermediate level) by the intermediate grinding unit 90 (process P6 of FIG. 5). Further, the re-grinding of the first wafer W in this intermediate grinding unit 90 is performed under the same conditions as those of the first intermediate grinding of the first wafer W in the process P3. To be specific, the re-grinding by the intermediate grinding unit 90 is carried out without changing the relative inclination between the intermediate grinding unit 90 and the chuck 42.

Figure 4D:
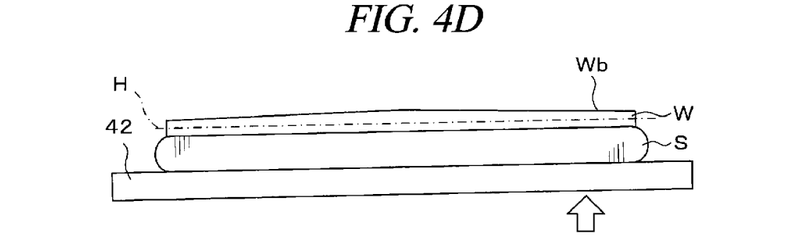

After the re-grinding of the first wafer W by the intermediate grinding unit 90 is carried out, the relative inclination between the chuck 42 and the finishing grinding unit 100 is then adjusted based on the TTV data of the first wafer W calculated in the process P5 (process P7 of FIG. 5), as shown in FIG. 4D. Specifically, the relative inclination is adjusted to increase a grounding amount at a position where the thickness of the first wafer W is found to be large in the thickness distribution of the first wafer W and to reduce the grounding amount at a position where the thickness is found to be small such that the in-surface thickness of the first wafer W after being re-ground in the finishing grinding unit 100 becomes uniform. That is, based on the thickness distribution of the first wafer W, the relative inclination of the chuck 42 and the finishing grinding unit 100 is adjusted, whereby a re-grinding amount of the first wafer W by the finishing grinding unit 100 is adjusted.

Figure 4E:
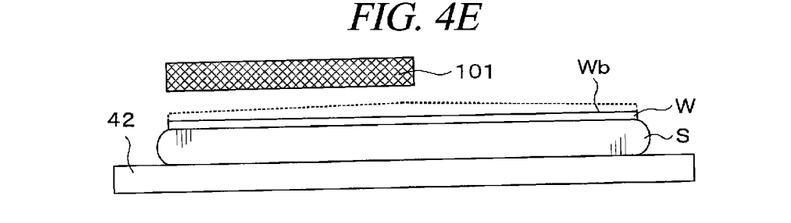

After the relative inclination between the finishing grinding unit 100 and the chuck 42 is adjusted, the rear surface Wb of the first wafer W is re-ground (finely ground) to the final thickness H by the finishing grinding unit 100 at the processing position A3, as illustrated in FIG. 4E (process P8 of FIG. 5).

In the present exemplary embodiment, the thickness distribution of the first wafer W is obtained and the TTV data is calculated before the first wafer W is ground to the final thickness as described above. Then, based on the thickness distribution and the TTV data, the relative inclination between the finishing grinding unit 100 and the chuck 42 is adjusted. Since the re-grinding of the first wafer W is performed after adjusting the relative inclination in this way, the deterioration of the TTV of the first wafer W can be suppressed even when the parallelism between the finishing grinding unit 100 and the chuck 42 is deteriorated. Further, since the TTV of the combined wafer T is improved based on the thickness distribution of the first wafer W as a grinding target as described above, it is not necessary to grind a wafer for inclination adjustment (for example, a dummy wafer) in advance, that is, it is not necessary to discard the wafer for inclination adjustment as in the prior art.

If the first wafer W is formed to have the final thickness through the re-grinding (finishing grinding), the thickness of the first wafer W after being subjected to the re-grinding processing in the process P8 is then measured by the thickness measuring device 110 at multiple points to obtain a final thickness distribution of the first wafer W, and, then, the TTV data is calculated from this final thickness distribution (process P9 of FIG. 5). The calculated TTV data is outputted to the controller 120.

The combined wafer T whose TTV data has been calculated is then transferred from the delivery position A0 to the second cleaning unit 70 by the transfer unit 30, and the rear surface Sb of the second wafer S is cleaned and dried in the state that the combined wafer T is held by the transfer pad 32 (process P10 of FIG. 5).

Next, the combined wafer T is transferred from the second cleaning unit 70 to the first cleaning unit 60 by the transfer unit 30, and the rear surface Wb of the first wafer W is subjected to finishing cleaning by a cleaning nozzle (not shown) (process P11 of FIG. 5).

Thereafter, the combined wafer T after being subjected to all the required processings is transferred to the cassette Ct of the cassette placing table 10 by the transfer fork 23 of the wafer transfer device 22. If this first sheet of combined wafer T is carried into the cassette Ct, the processings in the processing apparatus 1 are then performed on the second sheet of combined wafer T onwards accommodated in the cassette Ct.

The processings on the second sheet of combined wafer T onwards, that is, on the $n^{th}$ sheet of combined wafer T (n is a natural number equal to or larger than 2) in the processing apparatus 1 are performed in the alignment unit 50, the grinding unit 40, the second cleaning unit 70, and the first cleaning unit 60 in sequence.

Here, in the grinding processing of the first sheet of combined wafer T in the grinding unit 40, the re-grinding processing (the processes P5 to P8 of FIG. 5) is performed based on the acquired thickness distribution of the first wafer W in order to consider the influence of the deterioration of the parallelism before and after the standby state of the processing apparatus 1 as stated above. In the grinding processing of the $n^{th}$ sheet of combined wafer T in the processing apparatus 1, however, since the parallelism between the finishing grinding unit 100 and the chuck 42 is adjusted by the grinding processing of the first sheet of combined wafer T, it is not necessary to perform the re-grinding processing of the first wafer W.

Therefore, in the grinding processing of the $n^{th}$ sheet of combined wafer T, the re-grinding processing (the processes P5 to P8 of FIG. 5) on the corresponding combined wafer T is not performed, and only a feedback control is performed based on the final thickness distribution obtained in the process P9 of FIG. 5.

Figure 7:
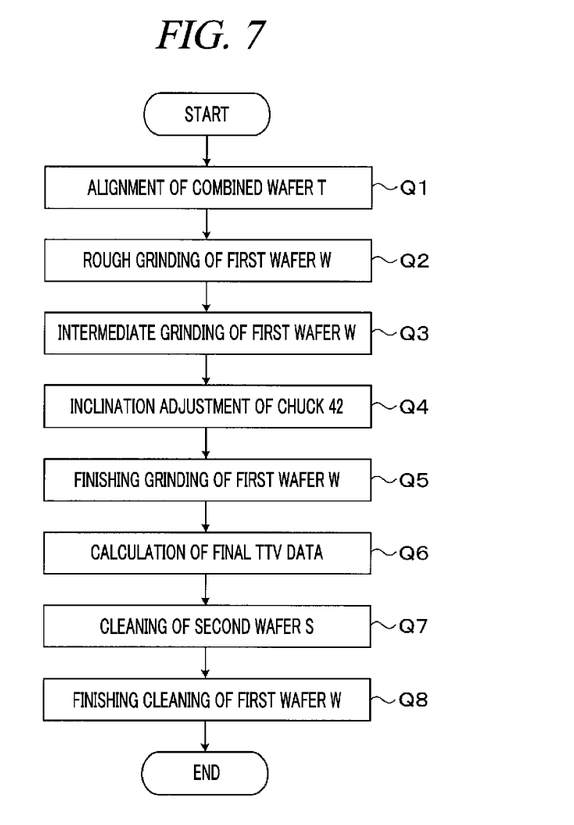
FIG. 7 is a flowchart illustrating individual processes of a processing of a second sheet of combined wafer onwards.

To elaborate, the $n^{th}$ sheet of combined wafer T carried out from the cassette Ct is first sent to the alignment unit 50 to be subjected to the direction adjustment in the horizontal direction (process Q1 of FIG. 7).

The combined wafer T whose direction in the horizontal direction has been adjusted is then transferred from the alignment unit 50 to the chuck 42 at the delivery position A0 by the transfer unit 30. Subsequently, the rotary table 41 is rotated to move the chuck 42 to the processing positions A1 to A3 in sequence.

At the processing position A1, the rear surface Wb of the first wafer W is roughly ground by the rough grinding unit 80 (process Q2 of FIG. 7). At the processing position A2, the rear surface Wb of the first wafer W is ground to the intermediate level by the intermediate grinding unit 90 (process Q3 of FIG. 7).

After the intermediate grinding processing is performed on the combined wafer T, the relative inclination between the chuck 42 and the finishing grinding unit 100 is adjusted based on the thickness distribution of the first sheet of first wafer W obtained in the process P9 of FIG. 5 (process Q4 of FIG. 7). Thus, a variation in the parallelism between the finishing grinding unit 100 and the chuck 42 resulted from a change in the device characteristic (for example, wear-out of the grinding whetstone or the device temperature) or the environmental characteristic (for example, the atmosphere temperature) due to the finishing grinding of the first sheet of combined wafer T is adjusted, that is, a result of the finishing grinding processing of the first sheet of combined wafer T is fed back to the finishing grinding processing of the $n^{th}$ sheet of combined wafer T.

Then, if the relative inclination between the finishing grinding unit 100 and the chuck 42 is adjusted, the first wafer W is finely ground to the final thickness at the processing position A3 (process Q5 of FIG. 7).

Thereafter, TTV data is calculated from the thickness distribution obtained by the thickness measuring device 110 (process Q6 of FIG. 7), and then, the combined wafer T after being subjected to the finishing grinding processing is subjected to the cleaning by the second cleaning unit 70 (process Q7 of FIG. 7) and the finishing cleaning by the first cleaning unit 60 (process Q8 of FIG. 7) in sequence, and is then accommodated in the cassette Ct. Then, upon the completion of the processing of all of the combined wafers T accommodated in the cassette Ct, the series of processings in the processing apparatus 1 are ended.

Furthermore, the adjustment of the relative inclination of the chuck 42 and the finishing grinding unit 100 in the process Q4 may be performed based on a final thickness distribution of the $m^{th}$ sheet of combined wafer T (m is a natural number equal to or larger than 1 and equal to or less than n−1) acquired in the process Q6, instead of the final thickness distribution of the first sheet of combined wafer T as described above. That is, the adjustment of the relative inclination just needs to be performed based on the final thickness distribution of the combined wafer T that has been processed prior to the $n^{th}$ sheet of combined wafer T.

Further, in the above-described exemplary embodiment, the processing of the combined wafers T in the processing apparatus 1 is performed sheet by sheet. That is, after the processing of one combined wafer T is completed, the processing of another combined wafer T is begun. However, the processing of the plurality of combined wafers T may be performed successively, that is, the processing of the plurality of combined wafers T may be performed simultaneously.

Furthermore, as in the processing apparatus 1 according to the present exemplary embodiment, when the grinding unit 40 is equipped with the plurality of (four in the present embodiment) chucks 42, the plurality of chucks 42 may be independently deformed in the standby state of the processing apparatus 1, resulting in the deterioration of the parallelism. For this reason, it is desirable that the adjustment of the relative inclination of the finishing grinding unit 100 and the chuck 42 and the re-grinding processing (processes P5 to P8 of FIG. 5) according to the present exemplary embodiment are performed in the processing of the first sheet of the combined wafer T held by each of the chucks 42 after the processing apparatus 1 returns from the standby state.

As described above, according to the processing method of the present exemplary embodiment, in the processing of the first sheet of combined wafer T held by each chuck 42 immediately after the processing apparatus 1 returns from the standby state, the thickness distribution of the first wafer W before the first wafer W is ground to the final thickness is obtained, and the inclination of the chuck 42 is adjusted based on this thickness distribution. Then, since the re-grinding processing of the first wafer W is performed in the state that the inclination of the chuck 42 is adjusted in this way, it is possible to improve the TTV of the first wafer W appropriately even when the parallelism between the finishing grinding unit 100 and the chuck 42 is degraded due to the standby of the processing apparatus 1.

In addition, since the TTV of the first wafer W is improved based on the thickness distribution of the first wafer W as the grinding target before the first wafer W is ground to the final thickness as described above, it is not necessary to perform the grinding of the wafer for inclination adjustment (for example, the dummy wafer) in advance. Therefore, it is possible to appropriately suppress the need to discard the wafer for inclination adjustment, which is required in the prior art.

Furthermore, in the re-grinding processing of the first wafer W in the present exemplary embodiment, the corresponding re-grinding processing is performed by two grinding units, that is, the intermediate grinding unit 90 and the finishing grinding unit 100. Here, if the re-grinding processing is performed only by, for example, the finishing grinding unit 100, the state of the first wafer W may be different at the beginning of the first grinding processing and the second grinding processing (re-grinding processing) performed by the finishing grinding unit 100. Specifically, the first grinding processing is performed by the finishing grinding unit 100 after the intermediate grinding processing, whereas the second grinding processing is performed by the finishing grinding unit 100 after the first grinding processing. As a result, a surface particle size of the first wafer W at the beginning of the second grinding processing by the finishing grinding unit 100 becomes smaller than the surface particle size at the beginning of the first grinding processing. If the surface state of the first wafer W is changed at the beginning of the grinding processing by the finishing grinding unit 100 as described above, there may be a risk that the required TTV may not be obtained even if the re-grinding processing of the first wafer W is performed as in the present exemplary embodiment.

In the present exemplary embodiment, however, since the re-grinding processing is performed by the intermediate grinding unit 90 and the finishing grinding unit 100, the state of the first wafer W in the first grinding processing can be appropriately reproduced before the start of the re-grinding processing by the finishing grinding unit 100. As a result, the TTV of the first wafer W can be more appropriately improved.

Moreover, in the present exemplary embodiment, the adjustment of the inclination between the grinding unit and the chuck 42 in the re-grinding processing is performed only in the finishing grinding unit 100, and is not performed in the intermediate grinding unit 90. Thus, the state of the first wafer W at the beginning of the grinding processing by the finishing grinding unit 100 can be more appropriately reproduced, and the TTV of the first wafer W can be more appropriately improved.

Further, although the above exemplary embodiment has been described for the example where the grinding unit 40 has the triaxial structure with the three grinding units (the rough grinding unit 80, the intermediate grinding unit 90, and the finishing grinding unit 100), the grinding unit 40 may have a biaxial structure with two grinding units (the rough grinding unit 80 and the finishing grinding unit 100). In this case, it is desirable that the re-grinding processing according to the present exemplary embodiment is performed in the rough grinding unit 80 and the finishing grinding unit 100 based on the thickness distribution of the first wafer W after being subjected to the first grinding processing.

Additionally, the present inventors have conducted intensive research on the re-grinding processing according to the above-described exemplary embodiment, and found out that the TTV of the first wafer W can be improved more appropriately by setting a grinding amount in the first grinding and a grinding amount in the second (re-grinding) grinding in the grinding unit 40 to be same. More specifically, when the grinding unit 40 has, for example, the triaxial structure, by setting the grinding amount in the first grinding to be equal to the grinding amount in the second re-grinding in the intermediate grinding unit 90 and by setting the grinding amount in the first grinding to be equal to the grinding amount in the second re-grinding (finishing grinding amount) in the finishing grinding unit 100, the TTV of the first wafer W can be improved appropriately.

As depicted in FIG. 8A to FIG. 8D, the present inventors have performed the grinding processing on the first wafer W having a thickness of 775 µm such that the first wafer W after being subjected to finishing grinding has a thickness of 100 µm, and the in-surface thickness distribution of the first wafer W after being subjected to the finishing grinding processing is measured. As shown in FIG. 8A to FIG. 8D, in a comparative example and experimental examples 1 to 3, the grinding amount in each grinding unit has been varied.

Figures 8A, 8B, 8C, 8D:
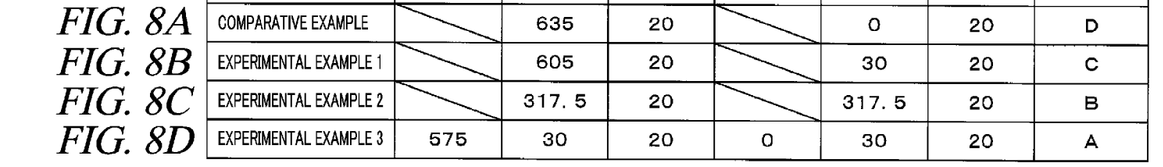
FIG. 8A to FIG. 8D are tables showing a relationship between a grinding amount of the first wafer and a TTV after finishing grinding.

First, as shown in the comparative example of FIG. 8A, the present inventors have performed a first grinding processing of 635 µm in the grinding unit before the finishing grinding and have performed a second grinding processing of 20 µm in the finishing grinding unit 100 in a grinding processing of a first cycle in the grinding unit 40. Further, in a re-grinding processing of a second cycle, only a second re-grinding processing of 20 µm has been performed in the finishing grinding unit 100. As depicted in FIG. 8A, when the re-grinding processing is performed only by the finishing grinding unit 100 in the grinding unit 40, the TTV calculated from the final thickness distribution of the first wafer W is not properly improved as compared to the conventional case in which the re-grinding processing is not performed.

Next, as shown in the experimental example 1 of FIG. 8B, the present inventors have performed a first grinding processing of 605 µm in the grinding unit before the finishing grinding and have performed a second grinding processing of 20 µm in the finishing grinding unit 100 in the grinding processing of the first cycle in the grinding unit 40. Further, in the re-grinding processing of the second cycle, a first re-grinding processing of 30 µm has been performed in the grinding unit before the finishing grinding where the first grinding processing has been performed, and a second re-grinding processing of 20 µm has been performed in the finishing grinding unit 100. As shown in FIG. 8B, when the re-grinding of the first wafer W is performed in the grinding unit before the finishing grinding as well as in the finishing grinding unit 100, the TTV calculated from the final thickness distribution of the first wafer W is found to be improved, as compared to the comparative example shown in FIG. 8A.

In addition, as shown in the experimental example 2 of FIG. 8C, the present inventors have performed a first grinding processing of 317.5 µm in the grinding unit before the finishing grinding and have performed a second grinding processing of 20 µm in the finishing grinding unit 100 in the grinding processing of the first cycle in the grinding unit 40. Further, in the re-grinding processing of the second cycle, a first re-grinding processing of 317.5 µm has been performed in the grinding unit before the finishing grinding where the first grinding processing has been performed, and a second re-grinding processing of 20 µm has been performed in the finishing grinding unit 100. As shown in FIG. 8C, when the grinding amounts in the grinding unit before the finishing grinding and the finishing grinding unit 100 in the first cycle are respectively set to be equal to the grinding amounts in the grinding unit before the finishing grinding and the finishing grinding unit 100 in the second cycle, the TTV calculated from the final thickness distribution of the first wafer W is found to be further improved as compared to the experimental example 1.

Furthermore, as shown in the experimental example 3 of FIG. 8D, the present inventors have performed a rough grinding of 575 µm in the rough grinding unit 80, an intermediate grinding of 30 µm as the first grinding in the intermediate grinding unit 90, and a finishing grinding of 20 µm as the second grinding in the finishing grinding unit 100 in the grinding processing of the first cycle in the grinding unit 40. Further, in the re-grinding processing of the second cycle, an intermediate grinding of 30 µm as the first re-grinding in the intermediate grinding unit 90 and a finishing grinding of 20 µm as the second re-grinding in the finishing grinding unit 100 have been performed. As shown in FIG. 8D, by setting the grinding amounts in the intermediate grinding unit 90 and the finishing grinding unit 100 in the first cycle to be equal to the grinding amounts in the intermediate grinding unit 90 and the finishing grinding unit 100 in the second cycle in the grinding unit 40, the TTV calculated from the final thickness distribution of the first wafer W is found to be further improved as compared to the experimental example 2.

As stated above, as shown in FIG. 8A to FIG. 8D, by setting the grinding amount of the first cycle to be equal to the grinding amount of the second cycle (re-grinding) in the grinding unit 40, the TTV of the first wafer W can be improved more appropriately.

Further, as described above, the TTV of the first wafer W after the finishing grinding processing in the experimental example 3 is further improved from the TTV of the first wafer W after the finishing grinding processing in the experimental example 2. As can be seen from this comparison, it is desirable that the grinding amounts in the 'first re-grinding' and the 'second re-grinding' of the first wafer W to be subjected to the grinding processing on the chuck 42 for the first time is equal to the grinding amounts in the 'first grinding' as the grinding processing before the finishing grinding and the 'second grinding' as the finishing grinding processing of the first wafer W to be subjected to the grinding processing for the $n^{th}$ time.

That is, when performing the grinding processing of the first wafer W by using, for example, the triaxial grinding unit 40, the re-grinding processing is not performed on the $n^{th}$ sheet of first wafer W as described above, and the rough grinding of 625 µm, the intermediate grinding of 30 µm and the finishing grinding of 20 µm are sequentially performed thereon. Here, in the grinding of the $n^{th}$ sheet of first wafer W, these intermediate grinding and finishing grinding correspond to the 'first grinding' and the 'second grinding', respectively. Then, by setting the grinding amounts of the 'first re-grinding' and the 'second re-grinding' of the first sheet of first wafer W to be equal to the 'intermediate grinding amount' and the 'finishing grinding amount' of the $n^{th}$ sheet of first wafer, respectively, the TTV of the first wafer W can be improved more appropriately, as shown in the comparison result of the experimental examples 2 and 3.

In view of the above results, it is desirable that the grinding amount of the first sheet of first wafer W by each grinding unit is determined by the following method. That is, first, the grinding amounts of the 'first re-grinding' and the 'second re-grinding' in the re-grinding processing of the first sheet of first wafer W in the second cycle are decided based on the actual grinding amount of the $n^{th}$ sheet of first wafer W. Next, the grinding amounts of the "first grinding" and the "second grinding" in the first cycle of grinding processing is decided so that they are equal to the grinding amount in the second cycle of re-grinding processing. Then, finally, a difference from the required grinding amount in the grinding unit 40 is set as the rough grinding amount.

Furthermore, in the above-described exemplary embodiment, only the first sheet of combined wafer T held by the chuck 42 is subjected to the re-grinding processing. However, the re-grinding processing may also be performed on the $n^{th}$ sheet of combined wafer T. By performing the re-grinding processing on the $n^{th}$ sheet of combined wafer T as well, it is possible to further improve the TTV of the $n^{th}$ sheet of combined wafer T. However, the inclination of the chuck 42 is already adjusted in the processing of the first sheet of combined wafer T as described above, and a change in the parallelism between the finishing grinding unit 100 and the chuck 42 resulted from the finishing grinding of the combined wafer T is sufficiently small as compared to a change in the parallelism in the standby state of the processing apparatus 1. Taking this into consideration, only by feeding back a finishing grinding result of the $m^{th}$ sheet of combined wafer T without performing the re-grinding processing for the processing of the $n^{th}$ sheet of combined wafer T, deterioration of the TTV can be appropriately suppressed. Moreover, as compared with a case where the re-grinding processing is performed on all the combined wafers T, the time taken for the grinding processing in the processing apparatus 1 can be shortened.

In addition, in the above-described exemplary embodiment, the relative inclination of the finishing grinding unit 100 and the chuck 42 is adjusted by tilting the chuck base 43 with the inclination adjusting device 44. However, the relative inclination may be adjusted by tilting the finishing grinding unit 100, for example. Moreover, the inclination adjusting device 44 may not be used as long as the finishing grinding amount of the first wafer W can be adjusted, for example.

Furthermore, in the above-described exemplary embodiment, the first wafer W in the combined wafer T in which the first wafer W and the second wafer S are bonded to each other is thinned by being ground in the processing apparatus 1. However, the first wafer W to be thinned does not have to be bonded to the second wafer S.

It should be noted that the above-described exemplary embodiment is illustrative in all aspects and is not anyway limiting. The above-described exemplary embodiment may be omitted, replaced and modified in various ways without departing from the scope and the spirit of claims.

According to the exemplary embodiments, it is possible to appropriately improve the flatness of the substrate after being subjected to the grinding processing.

I claim:

1. A processing method of processing a substrate in a processing apparatus, the processing method comprising:
    performing a first grinding processing on the substrate in a first grinder;
    thereafter, performing a second grinding processing on the substrate in a second grinder;
    thereafter, measuring a thickness distribution of the substrate after being subjected to the second grinding processing:
    thereafter, performing a first re-grinding processing on the substrate in the first grinder without changing a relative inclination between a substrate holder configured to hold the substrate and the first grinder as in the first grinding processing; and
    thereafter, performing a second re-grinding processing on the substrate in the second grinder, the substrate being ground to a final thickness in the second re-grinding processing,
    wherein the second re-grinding processing is performed in a state that the substrate is maintained at a relative inclination between the substrate holder and the second grinder determined based on the measured thickness distribution.

2. The processing method of claim 1,
    wherein a grinding amount of the substrate in the first grinding processing is equal to a grinding amount of the substrate in the first re-grinding processing, and
    a grinding amount of the substrate in the second grinding processing is equal to a grinding amount of the substrate in the second re-grinding processing.

3. The processing method of claim 1, further comprising:
    performing a rough grinding to reduce a thickness of the substrate, before the first grinding processing.

4. The processing method of claim 3,
    wherein a grinding amount of the substrate in the rough grinding is larger than the grinding amount of the substrate in the first grinding processing and is larger than the grinding amount of the substrate in the second grinding processing.

5. The processing apparatus of claim 1,
    wherein the controller controls the first grinder and the second grinder such that a grinding amount of the substrate in the first grinding processing is equal to a grinding amount of the substrate in first re-grinding processing, and such that a grinding amount of the substrate in the second grinding processing is equal to a grinding amount of the substrate in the second re-grinding processing.

6. The processing apparatus of claim 1,
    wherein:
    multiple substrates are successively processed,
    the controller is configured to control the thickness distribution measuring device to measure a final thickness distribution of the substrate, and
    the controller is configured to perform, on a first sheet of substrate held by the substrate holder, a re-grinding processing of the substrate by the first grinder and the second grinder, and
    the controller is configured to control the first grinder and the second grinder to perform, on a $n^{th}$ sheet of substrate (n is a natural number equal to or larger than 2) held by the substrate holder, a before-finishing grinding processing in the first grinder and a finishing grinding processing in the second grinder to finely grind the substrate to a final thickness, based on the final thickness distribution measured in a $m^{th}$ sheet of substrate (m is a natural number equal to or larger than 1 and equal to or less than n−1).

7. The processing apparatus of claim 6,
wherein the controller is configured to control the first grinder and the second grinder such that a grinding amount of the substrate in the first re-grinding processing is equal to a grinding amount of the substrate in the before-finishing grinding processing, and such that a grinding amount of the substrate in the second re-grinding processing is equal to a grinding amount of the substrate in the finishing grinding processing.

8. A processing method of processing a substrate in a processing apparatus, the processing method comprising:
processing multiple substrates successively in the processing apparatus;
performing a first grinding processing on the substrate in a first grinder;
performing a second grinding processing on the substrate in a second grinder;
performing a first re-grinding processing on a first sheet of substrate held by a substrate holder in the first grinder; and
performing a second re-grinding processing on the first sheet of substrate in the second grinder, wherein the first sheet of substrate is ground to a final thickness in the second re-grinding processing;
measuring a final thickness distribution of the first sheet of substrate; and
processing a $n^{th}$ sheet of substrate (n is a natural number equal to or larger than 2) held by the substrate holder without performing the first re-grinding processing and the second re-grinding processing,
wherein the $n^{th}$ sheet of substrate is subjected to, based on the final thickness distribution measured in a $m^{th}$ sheet of substrate (m is a natural number equal to or larger than 1 and equal to or less than n−1), a before-finishing grinding processing in the first grinder and a finishing grinding processing in the second grinder to be finely ground to a final thickness.

9. The processing method of claim 8,
wherein a grinding amount of the substrate in the first re-grinding processing is equal to a grinding amount of the substrate in the before-finishing grinding processing, and
a grinding amount of the substrate in the second re-grinding processing is equal to a grinding amount of the substrate in the finishing grinding processing.

10. A processing apparatus configured to perform a grinding processing on a substrate, comprising:
a first grinder configured to perform a first grinding processing on the substrate;
a second grinder configured to perform a second grinding processing on the substrate;
a substrate holder configured to hold the substrate;
a thickness distribution measuring device configured to measure a thickness distribution of the substrate:
an inclination adjusting device configured to adjust a relative inclination between the substrate holder and the second grinder; and
a controller and a storage storing a computer program, wherein the storage and the computer program are configured, with the controller, to control the grinding processing of the substrate,
wherein the controller is configured to control the processing apparatus to:
perform the first grinding processing on the substrate in the first grinder,
thereafter, perform the second grinding processing on the substrate in the second grinder,
thereafter, measure a thickness distribution of the substrate after being subjected to the second grinding processing,
thereafter, perform a first re-grinding processing on the substrate in the first grinder without changing a relative inclination between a substrate holder configured to hold the substrate and the first grinder as in the first grinding processing, and
thereafter, perform a second re-grinding processing on the substrate in the second grinder to thereby finely grind the substrate to a final thickness in the second re-grinding processing, and
wherein the second re-grinding processing is performed in a state that the substrate is maintained at a relative inclination between the substrate holder and the second grinder determined based on the measured thickness distribution.

11. The processing apparatus of claim 10, further comprising:
a rough grinding device configured to reduce a thickness of the substrate.

12. The processing apparatus of claim 11,
wherein the controller is configured to control the rough grinding device such that a grinding amount of the substrate in the rough grinding device is larger than grinding amounts of the substrate in the first grinding processing and the second grinding processing.

* * * * *